United States Patent [19]

Heaney et al.

[11] Patent Number: 5,175,751
[45] Date of Patent: Dec. 29, 1992

[54] PROCESSOR STATIC MODE DISABLE CIRCUIT

[75] Inventors: Brad Heaney, Mountain View; Andy Hou, Cupertino, both of Calif.

[73] Assignee: Intel Corporation, Santa Clara, Calif.

[21] Appl. No.: 775,811

[22] Filed: Oct. 11, 1991

Related U.S. Application Data

[63] Continuation-in-part of Ser. No. 625,847, Dec. 11, 1990, Pat. No. 5,107,523.

[51] Int. Cl.⁵ .................. H03K 5/19; H03M 13/00; G06F 11/00
[52] U.S. Cl. .......................... 377/2; 377/20; 377/28; 328/138; 307/518; 371/14; 371/62; 364/484
[58] Field of Search ................. 307/296.4, 296.5, 518; 328/138; 371/14, 62; 377/2, 28, 20; 364/484

[56] References Cited

U.S. PATENT DOCUMENTS

| | | | |
|---|---|---|---|
| 3,757,233 | 9/1973 | Dixon | 328/138 |
| 4,326,256 | 4/1982 | Furumoto | 364/484 |
| 4,390,843 | 6/1983 | Betts et al. | 328/138 |
| 4,428,020 | 1/1984 | Blanchard | 307/296.4 |
| 4,737,984 | 4/1988 | Brown | 328/138 |
| 4,882,545 | 11/1989 | Plant | 377/28 |

Primary Examiner—John S. Heyman
Attorney, Agent, or Firm—Blakely, Sokoloff, Taylor & Zafman

[57] ABSTRACT

An input to the control unit of a microprocessor places the microprocessor in a WAIT condition whenever the input clock frequency is determined to be less than a predetermined minimum value. A timing circuit which includes a relatively high capacitance device generates a "kill" signal whenever the time interval between successive clock pulses is greater than a value corresponding to a cut-off frequency. The kill signal is applied to the control unit of the microprocessor and cannot be reset except with a system reset.

10 Claims, 4 Drawing Sheets

FIG_1
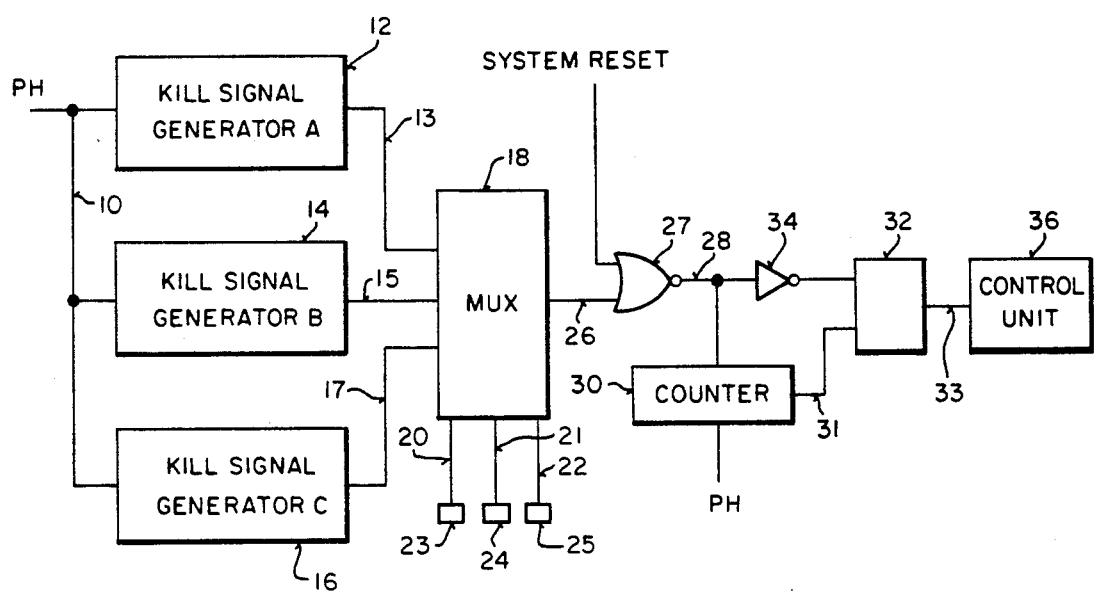
FIG_2
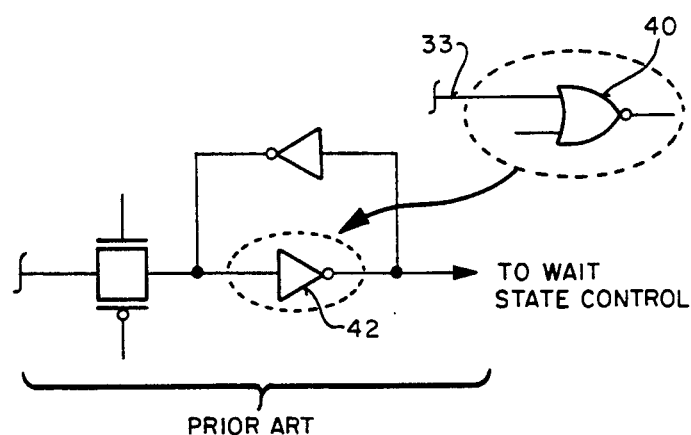
PRIOR ART

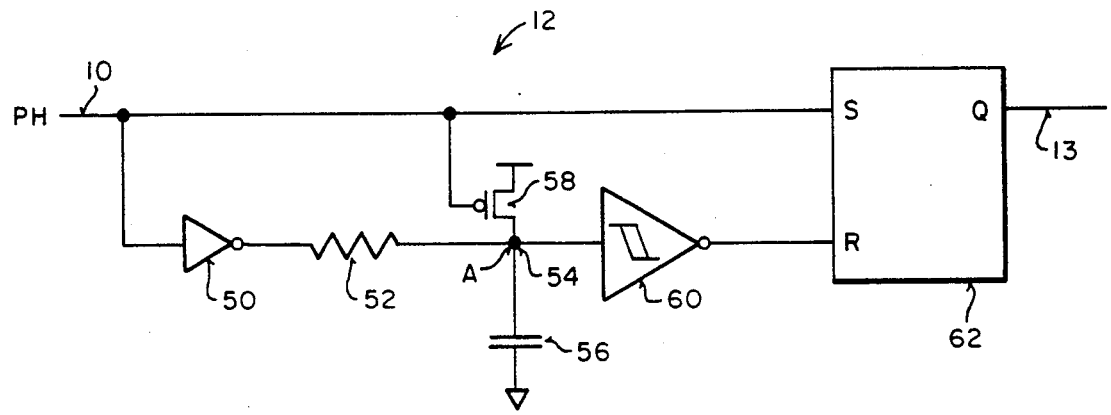
FIG_3
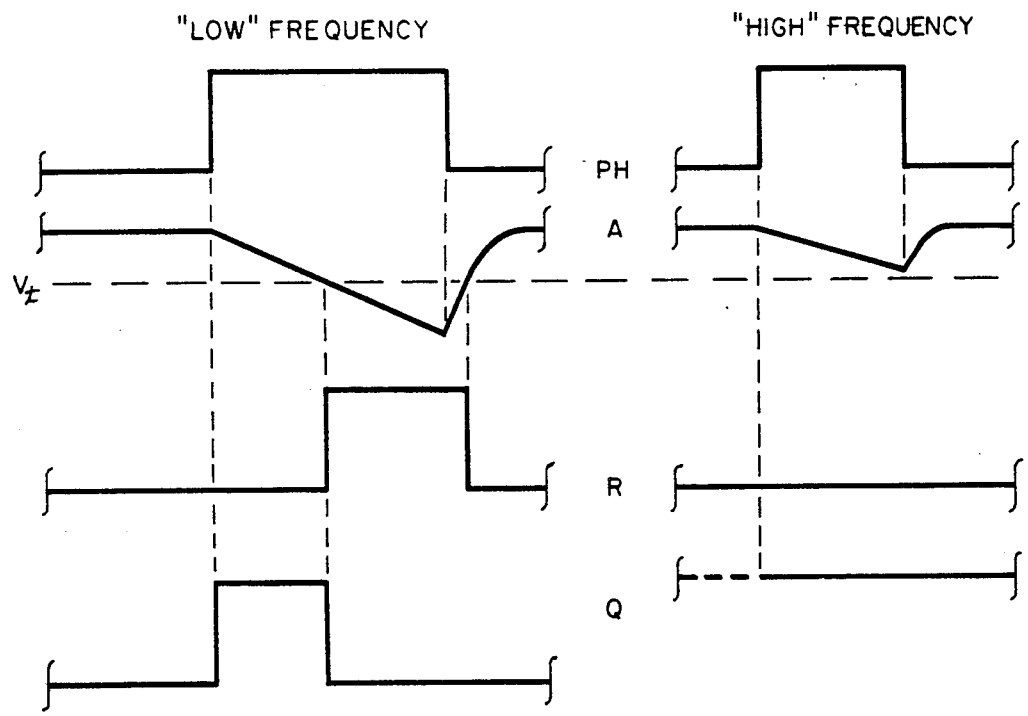
FIG_4

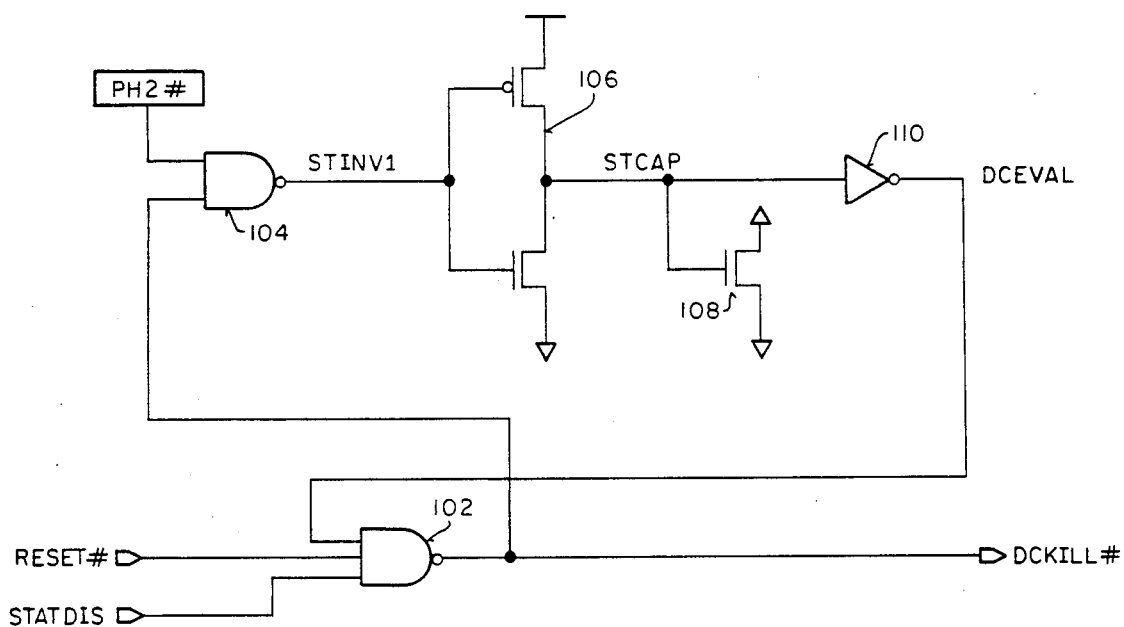
FIG_5
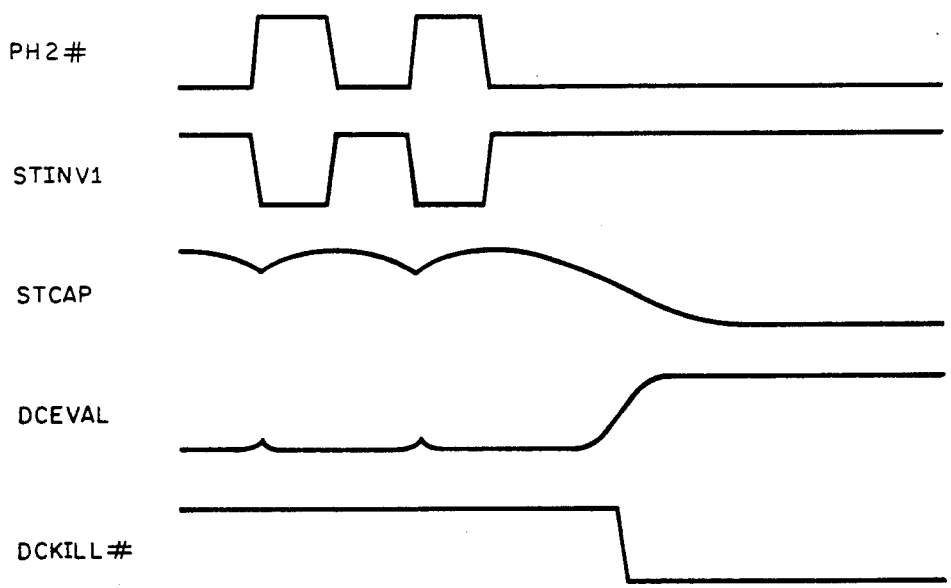
FIG_6

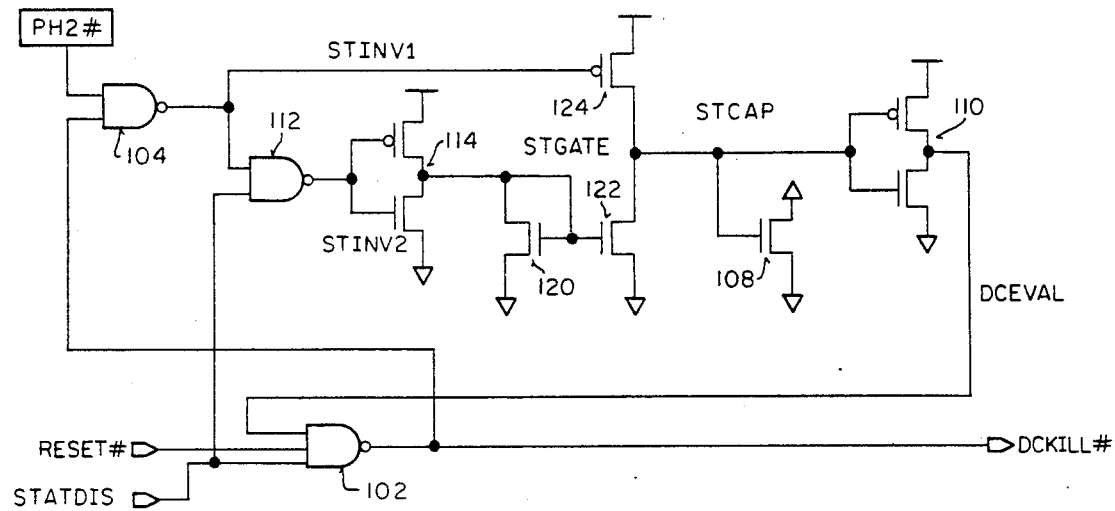
FIG_7
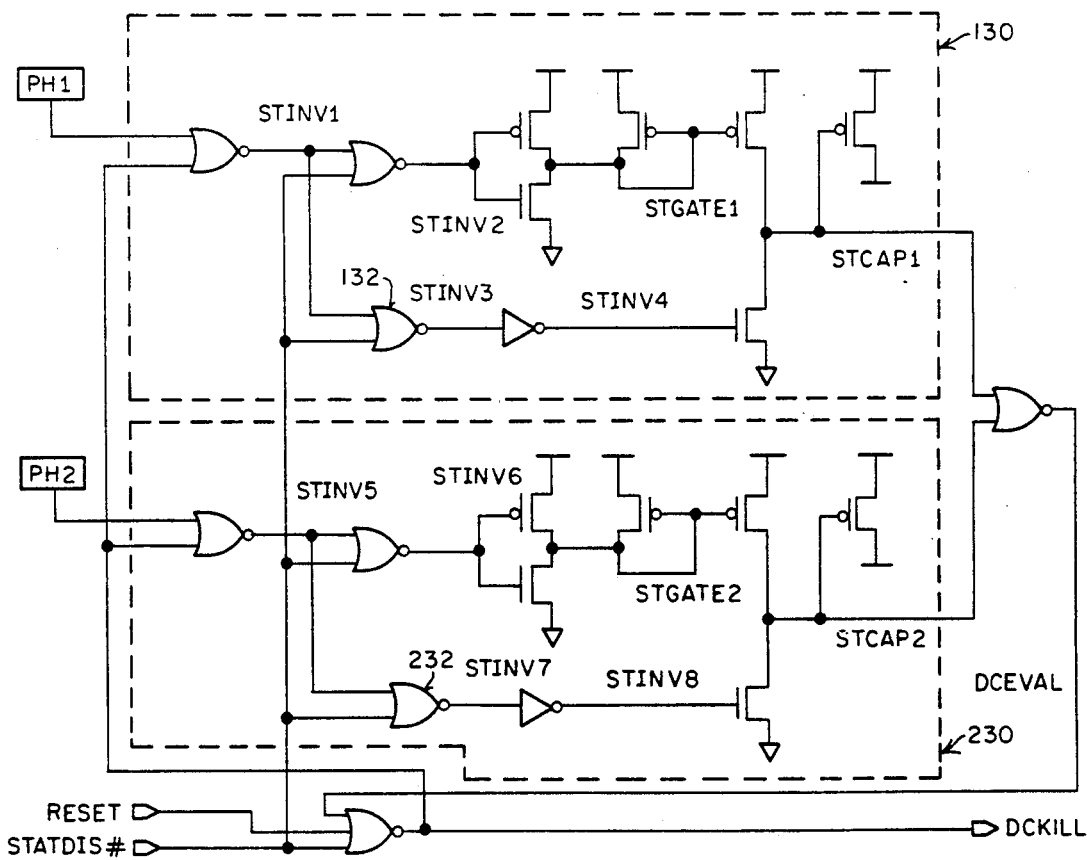
FIG_8

PROCESSOR STATIC MODE DISABLE CIRCUIT

RELATED APPLICATION

This is a continuation-in-part of application Ser. No. 07/625,847 filed Dec. 11, 1990 U.S. Pat. No. 5,107,523.

FIELD OF THE INVENTION

This invention relates to the field of microprocessor design, and in particular to a method and apparatus for regulating the operation of a microprocessor in response to an input clock frequency that is not in compliance with the processor specifications.

BACKGROUND OF THE INVENTION

Designers of microprocessor based systems are almost always seeking to increase the operating speed of the processor. Thus, in recent years, microprocessor specifications have offered ever-increasing operating speeds. However, for any given design of a microprocessor, manufacturing tolerances will affect the actual maximum speed at which the processor will operate reliably. Thus, particular microprocessor chips of a given design will likely have different maximum operating speeds. Accordingly, it is not uncommon in the industry to qualify microprocessor chips in several "grades" according to the maximum clock frequency at which they will operate. Thus, for example, certain chips of a single microprocessor design might be qualified for operation at a particular clock frequency, say 25 megahertz, while other chips might be qualified at lower frequencies, say 20 and 16 megahertz. Generally speaking, chips qualified at higher operating clock frequencies will command higher prices.

Typical microprocessor designs provide for a clock input to be provided by off-chip circuitry, usually comprising a crystal oscillator. Therefore, the microprocessor manufacturer has no direct control over the frequency of the clock signal that will be applied to the clock input of the microprocessor. While the maximum clock frequency of the microprocessor is specified by the manufacturer, a purchaser of a microprocessor chip may attempt to increase the performance of the microprocessor by applying a clock signal having a frequency higher than that which is specified as the maximum frequency. This can result in malfunction of the microprocessor and unpredictable data results. Such results may adversely reflect on the reputation of the microprocessor manufacturer. Accordingly, there is a need for a method and apparatus for governing the maximum operating speed of a microprocessor that is solely under the control of the chip manufacturer. Furthermore, there is a need for selecting one of a plurality of maximum operating speeds depending upon the qualification level of each particular chip.

It is also desirable for the microprocessor manufacturer to have some means for controlling the minimum frequency of the microprocessor. For example, a particular microprocessor design may incorporate a static mode whereby the clock signal may be removed altogether without disrupting operation of the microprocessor when the clock signal is restored. In some circumstances, it may be desirable to disable this particular feature to render the microprocessor "non-static" so that if the clock signal is removed and later restored, the microprocessor must undergo a system reset before operations can resume.

SUMMARY OF THE INVENTION

The present invention provides an input to the control unit of a microprocessor to place the microprocessor in a WAIT condition whenever the input clock frequency is determined to be less than a predetermined minimum value. A timing circuit which includes a relatively high capacitance device generates a "kill" signal whenever the time interval between successive clock pulses is greater than a value corresponding to a cut-off frequency. The kill signal is applied to the control unit of the microprocessor and cannot be reset except with a system reset.

BRIEF DESCRIPTION OF THE DRAWINGS

FIG. 1 is a functional block diagram of a clock governor circuit for preventing clock frequencies exceeding an upper cutoff frequency.

FIG. 2 illustrates modification of a prior art microprocessor control unit for implementation of the present invention.

FIG. 3 is a simplified circuit schematic of the kill signal generator of FIG. 1.

FIG. 4 illustrates the signal waveforms of the circuit of FIG. 3.

FIG. 5 is a simplified circuit schematic of a DC kill signal generator according to the present invention.

FIG. 6 is a timing diagram illustrating the operation of the circuit of FIG. 5.

FIG. 7 is a simplified circuit schematic of an alternative embodiment of the present invention.

FIG. 8 is a simplified circuit schematic of a further alternative embodiment of the present invention.

DETAILED DESCRIPTION OF THE INVENTION

In the following description, for purposes of explanation and not limitation, specific circuits, components, waveforms, etc. are set forth in order to provide a thorough understanding of the present invention. However, it will be apparent to one skilled in the art that the present invention may be practiced in other embodiments that depart from these specific details. In other instances, detailed descriptions of well known aspects of microprocessor systems and digital circuits are omitted so as to not obscure the description of the present invention with unnecessary detail.

Clock Governor

FIG. 1 is a functional block diagram of a clock governor circuit. A microprocessor clock signal PH is applied to line 10. This signal is one of the processor phase clock signals and in most microprocessor implementations, this will be at a frequency equal to one-half of the external clock frequency. The processor phase clock signal is applied to kill signal generators 12, 14 and 16, the details of which will be more fully described below. Each of the kill signal generators is tuned to a cut-off frequency such that a kill signal output is generated if the frequency of the input clock signal is greater than the cut-off frequency. In a preferred embodiment, kill signal generators 12, 14 and 16 are tuned to cut-off frequencies of 16, 20 and 25 megahertz, respectively. However, it will be understood that the kill signal generators may be tuned to any set of frequencies corresponding to performance thresholds of the microprocessor. Furthermore, while the circuit of FIG. 1 comprises three kill signal generators, it will be understood that any number of such generators may be employed depending upon the desired number of qualification levels.

Kill signal generators 12, 14 and 16 provide kill signal outputs 13, 15 and 17, respectively, to multiplexer 18. Selection inputs 20, 21 and 22 select an input of multiplexer 18 to be applied to output 26. Three selection lines are employed to accommodate additional inputs to multiplexer 18. Selection lines 20, 21 and 22 are coupled to bond pads 23, 24 and 25, respectively. These pads are selectively coupled to $V_{cc}$ or ground at the time that the microprocessor chip is packaged as a function of the desired cut-off clock frequency. Thus, the cut-off frequency is determined by the manufacturer of the microprocessor and cannot be altered.

Output 26 of multiplexer 18 is asserted at an input of NOR gate 27, the other input of which is coupled to a system reset signal. Output 28 of NOR gate 27 is coupled to counter 30. In a preferred embodiment, counter 30 is a four-bit ripple counter comprising four D-type flip-flops. Line 28 is coupled to the reset input of each stage of the counter so that the counter is reinitialized whenever a positive going pulse is presented on line 28. The first stage of counter 30 is clocked by the processor phase clock signal and successive stages are clocked by the Q outputs of the preceding stage in conventional fashion. The Q output of the final stage is asserted on line 31. Thus, output 31 of counter 30 transitions to a logical high if and only if eight consecutive phase clock cycles occur at a frequency exceeding the cut-off frequency. Output signal 31 is therefore insensitive to occasional clock "glitches" that may trigger the selected kill signal generator. This prevents the processor from being halted accidentally due to a temporary change in the phase clock duty cycle.

Counter output 31 is asserted at SR latch 32. Latch 32 also receives counter reset signal 28 through inverter 34. Output 33 of SR latch 32 is asserted at control unit 36. Latch 32 allows the kill signal on line 33 to be reset during an externally generated system reset and will remain reset as long as the processor phase clock signal does not exceed the selected cut-off frequency. Latch 32 also allows resetting of the kill signal on line 33 when the frequency of the processor phase clock signal is reduced from above the cut-off frequency to a value below it.

Control unit 36 governs the operation of the microprocessor through execution of microcode. In an exemplary application of the present invention, illustrated in FIG. 2, the kill signal output of latch 32 on line 33 is coupled to an input of NOR gate 40. NOR gate 40 replaces an inverter 42 in the existing WAIT signal logic of the microprocessor. Thus, when a kill signal is asserted on line 33, the microprocessor control unit responds as if a WAIT condition is invoked and temporarily halts operation of the microprocessor. Operation will remain halted until the input clock signal at line 10 is restored to a frequency below the selected cut-off frequency. In this fashion, the processor is halted in a non-catastrophic fashion so that it can resume operation when the proper clock signal is restored without the need for a system reset.

Referring now to FIG. 3, the operation of kill signal generator 12 will be described in greater detail, the operation of kill signal generators 14 and 16 being identical except for the characteristic values of certain circuit components. The processor phase clock signal on line 10 is coupled to the input of inverter 50, to the gate of transistor 58 and also to the set input of flip-flop 62. The output of inverter 50 is coupled to resistor 52, the opposite terminal of which is coupled to circuit junction 54. Junction point 54 is also coupled to the drain of transistor 58, capacitor 56 and the input of Schmitt trigger 60. The inverting output of Schmitt trigger 60 is coupled to the reset input of flip-flop 62. The Q output of flip-flop 62 is coupled to line 13.

In a preferred embodiment of the above-described circuit implemented in connection with a CMOS microprocessor, resistor 52 and capacitor 56 are polycide elements. Tuning of the cut-off frequency in each of the kill signal generator circuits is accomplished during chip fabrication by changing the number of capacitive and resistive elements that are connected into the circuit by one of the metalization layers.

Referring also to FIG. 4, the operation of kill signal generator 12 will be described. When the processor phase clock signal is in a logical low state, transistor 58 is turned on, thereby rapidly charging capacitor 56 until signal "A" at junction point 54 is at a potential of $V_{cc}$. When the input clock signal goes to a logical high state, transistor 58 is switched off and capacitor 56 discharges through resistor 52 to the ground potential appearing at the output of inverter 50. The potential at junction point 54 decays at a rate determined by the values of capacitor 56 and resistor 52. If the input clock frequency has a "low" value, i.e., if the period of the clock signal is "long", the potential at junction point 54 will decay below threshold value $V_t$ causing the output of Schmitt trigger 60 to go to a logical high state. This resets flip-flop 62, and the Q output is forced to a logical low state. Referring briefly to FIG. 1, the transition to a low state of the Q output of flip-flop 62 on line 13 propagates to line 26 since it is presumed for purposes of this description that kill signal generator 12 is selected by multiplexer select lines 20-22. This causes the output of NOR gate 27 to transistion to a logical high state, thereby resetting counter 30.

On the other hand, if the input clock signal has a "high" frequency, i.e., if the clock period is "short", junction point 54 will not discharge below the threshold frequency of the Schmitt trigger and a reset signal will not be applied to flip-flop 62. Flip-flop 62 will remain in a set condition with the Q output at a logical high state. Referring back again to FIG. 1, this condition causes the output NOR gate 27 to remain at a logical low state allowing counter 30 to count up.

Static Mode Disable

The circuitry thus far described places the microprocessor in a WAIT condition whenever the input clock frequency is determined to be greater than a predetermined maximum value. It is also desirable to prevent the microprocessor from operating at clock frequencies below a predetermined minimum value. The circuitry described below monitors the input clock signal of the microprocessor and generates a kill signal when the clock period exceeds a predetermined maximum value, i.e., when the clock frequency is less than a predetermined value. This circuit is particularly useful for placing the microprocessor in a WAIT condition if the clock signal is removed altogether, i.e., to disable a static mode capability of a microprocessor. The "DC kill" signal thus generated may be combined with the kill signal generated on line 33 of the previously described clock governor circuitry so that the microprocessor is constrained to operate within an allowable range of clock frequencies.

Referring to FIG. 5, a simplified circuit for generating a DC kill signal is shown. NAND gate 102 receives signal STATDIS as an input. STATDIS is a control signal which is set by a bond pad connection at the time that the microprocessor chip is manufactured. For purposes of the following description, a chip in which signal STATDIS is set to a logical high will be a "non-static" chip, i.e., one in which the static mode is disabled by virture of the circuitry described below, whereas if signal STATDIS is set to a logical low, the chip is static mode enabled and the DC kill circuitry has no effect upon the operation of the microprocessor. NAND gate 102 also receives signal RESET# (the inverse of signal RESET) as an input. The RESET signal is a system reset, which is preferably the same signal as applied to NOR gate 27 of the clock governor circuit shown in FIG. 1. The third input to NAND gate 102 is signal DCEVAL which is fed back from the output of inverter 110.

The output of NAND gate 102 is asserted at an input of NAND gate 104. Clock signal PH2# is asserted as a second input to NAND gate 104. It will be understood that signal PH2# is the inverse of one of the complementary phase clock signals that control operation of the microprocessor. The output of NAND gate 104 is asserted at the input of inverter 106, the output of which is coupled to the gate of transistor 108. In this circuit, transistor 108 functions simply as a capacitor. The signal at the gate of transistor 108, designated as signal STCAP, is asserted at the input of inverter 110, the output of which is fed back to an input of NAND gate 102 as described above.

Referring now also to FIG. 6, the operation of the circuit illustrated in FIG. 5 will be briefly described. For a "non-static" microprocessor chip, the circuit is initialized with signal RESET# which goes low forcing the output of NAND gate 102 high. This allows NAND gate 104 to act as an inverter for input signal PH2# thereby allowing signal STCAP to charge up to a high level. This, in turn, forces sigal DCEVAL low, thereby latching the output of NAND gate 102, signal DCKILL#, high. Transistor 108 is sized so that the gate will only partially discharge during the low cycles of clock signal PH2#. If the phase clock signal is is removed in PH2 (i.e., with signal PH2# low), or if the frequency of the phase clock signal falls below a predetermined cut-off frequency, STCAP will discharge below the trip point of inverter 110 causing signal DCEVAL to go high. With all inputs to NAND gate 102 high, signal DCKILL# goes low and places the microprocessor in the WAIT condition. Since NAND gate 104 is thereby disabled, the circuit is latched until the system RESET signal is again asserted.

It will be noted that in the case of a "static" microprocessor chip (STATDIS=0), signal DCKILL# cannot go low, and thus the WAIT condition of the microprocessor will not be invoked regardless of the clock frequency.

In order to prevent discharging the gate of transistor 108 at a low but still acceptable frequency, on the order of one MegaHertz or lower, the physical size of transistor 108 becomes unacceptably large. Referring now to FIG. 7, an alternative circuit is shown in which the device sizes are more acceptable. In this case, a current mirror circuit is employed to reduce the discharging current.

The output NAND gate 104 is asserted at the gate of transistor 124 and at the input of NAND gate 112. The output of NAND gate 112 is asserted at the input of inverter 114, which comprises transistors 116 and 118. The output of inverter 114, signal STGATE, is couple to the gate terminals of transistors 120 and 122. The voltage at this point is ratioed between transistors 116 and 120 when PH2# is low. The STGATE voltage is set to a relatively low value so that the current through transistor 122 is reduced in comparison to the design shown in FIG. 5, thereby allowing the area of transistor/capacitor 108 to be significantly reduced while maintaining the same cut-off frequency.

NAND gate 112 also receives signal STATDIS as an input so that the current mirror is turned off in the case of a "static" chip (STATDIS=0). In the case of a "non-static" chip (STATDIS=1), current will continue to flow since transistor 116 remains on.

It will be noted that the area of transistor/capacitor 108 can be still further reduced while still maintaining the same cut-off frequency and margin by having a lower trip point at inverter 110.

The circuits shown in FIGS. 5 and 7 presume that the phase clock will stop in PH2 (i.e., with PH2# low). In the event that the clock may be stopped in either phase PH1 or PH2, duplicate current mirror circuits 130 and 230 may be employed for each of the two phase clock signals as illustrated in FIG. 8. These circuits are essentially identical to the circuit of FIG. 7 except that the current mirror is implemented with p-channel devices instead of n-channel devices. Substituting p-channel devices for n-channel devices permits a further reduction in device areas while maintaining the same cut-off frequency and margin since p-channel current is approximately one-half of n-channel current. It will be note that the sense of all input and output signals is inverted in the circuit of FIG. 8 as compared to the circuits of FIGS. 5 and 7.

NOR gates 132 and 232 are added to circuits 130 and 230, respectively. These NOR gates receive signal STATDIS# as inputs. For a "static" chip (STATDIS#=1), nodes STCAP1 and STCAP2 are pulled low rather than allowed to float as is the corresponding STCAP node in the circuit illustrated in FIG. 7.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

We claim:

1. In a processor having a processor clock signal comprising a cyclical sequence of clock pulses and a control unit for executing microcode to control operation of the processor, an apparatus for governing operation of the processor comprising:
   first circuit means for receiving the processor clock signal and generating a first signal when the interval between successive clock pulses is greater than a predetermined value;
   second circuit means for receiving the first signal and a processor reset signal and for generating a second signal in response to the first signal that latches the first circuit means until the processor reset signal is received;
   third circuit means responsive to the second signal for suspending operation of the processor.

2. The device of claim 1 wherein the first circuit means includes a capacitive timing device.

3. The device of claim 2 wherein the first circuit means includes a current mirror circuit.

4. The device of claim 1 wherein the processor has first and second complementary processor clock signals each comprising a cyclical sequence of clock pulses and wherein the first circuit means comprises a pair of circuits, one associated with each of the clock signals, wherein the first signal is generated if the interval between successive clock pulses of either the first or second clock signal is greater than the predetermined value.

5. In a processor having first and second complementary clock signals each comprising a cyclical sequence of clock pulses and a control unit for executing microcode to control operation of the processor, an apparatus for governing operation of the processor comprising:
 a first timing circuit for receiving the first clock signal and having a first capacitive device;
 a second timing circuit for receiving the second clock signal and having a second capacitive device;
 a first gate coupled to the first and second capacitive devices for generating a first signal when the interval between successive clock pulses of either the first or second clock signal is greater than a predetermined value;
 a second gate for receiving the first signal as a first input and a processor reset signal as a second input and for generating a second signal as an output;
 wherein the second signal is coupled to the first and second timing circuits for latching operation thereof until the processor reset signal is received; and
 wherein the second signal is coupled to the control unit for suspending operation of the processor.

6. The device of claim 5 wherein the first and second timing circuits each include a current mirror circuit.

7. In a processor having a processor clock signal comprising a cyclical sequence of clock pulses and a control unit for executing microcode to control operation of the processor, a method for governing the operation of the processor comprising the steps of:
 setting a kill signal when the interval between successive clock pulses is greater than a predetermined value;
 latching the kill signal until a processor reset signal is received; and
 suspending operation of a processor when the kill signal is set.

8. The method of claim 7 wherein the operation of the processor is suspended by halting execution of microcode in the control unit.

9. The method of claim 7 further comprising the step of selectively disabling the kill signal to permit the processor to operate in a static mode.

10. The method of claim 9 wherein the kill signal is selectively disabled at the time of manufacturing the processor.

* * * * *